United States Patent
Chang et al.

(10) Patent No.: US 7,208,870 B2
(45) Date of Patent: Apr. 24, 2007

(54) SILVER ALLOY USED IN AN ORGANIC ELECTROLUMINESCENT PANEL

(75) Inventors: Yih Chang, Jhonghe (TW); Shang-Wei Chen, Jubei (TW); Tien Wang Huang, Taoyuan (TW); Tien-Rong Lu, Tainan (TW); Hsin Tzu Yao, Taipei (TW); Chih-Jen Yang, Hsin Chu Industrial Park (TW)

(73) Assignee: RiTdisplay Corporation, Hsin Chu Industrial Park (TW)

( * ) Notice: Subject to any disclaimer, the term of this patent is extended or adjusted under 35 U.S.C. 154(b) by 90 days.

(21) Appl. No.: 10/691,577

(22) Filed: Oct. 24, 2003

(65) Prior Publication Data
US 2004/0140760 A1    Jul. 22, 2004

(30) Foreign Application Priority Data
Oct. 25, 2002    (CN) .............................. 91 1 25346

(51) Int. Cl.
*H01J 1/62*    (2006.01)
*H01J 63/04*    (2006.01)

(52) U.S. Cl. ...................................... 313/506; 313/503
(58) Field of Classification Search ........ 313/503–506, 313/512; 428/690
See application file for complete search history.

(56) References Cited

U.S. PATENT DOCUMENTS

| | | | |
|---|---|---|---|
| 6,399,222 B2 * | 6/2002 | Arai et al. .................. 428/690 |
| 6,404,124 B1 * | 6/2002 | Sakemura et al. .......... 313/495 |
| 6,747,723 B2 * | 6/2004 | Hanakawa et al. ......... 349/147 |
| 6,805,977 B2 * | 10/2004 | Sotoyama et al. .......... 428/690 |
| 7,101,440 B2 * | 9/2006 | Nakamura et al. .......... 118/663 |
| 2001/0026126 A1 * | 10/2001 | Nakaya et al. .............. 313/506 |
| 2004/0057864 A1 * | 3/2004 | Chang et al. ............... 420/503 |
| 2004/0189188 A1 * | 9/2004 | Fan et al. .................... 313/504 |

* cited by examiner

*Primary Examiner*—Nimeshkumar D. Patel
*Assistant Examiner*—Kevin Quarterman
(74) *Attorney, Agent, or Firm*—Bacon & Thomas, PLLC

(57) ABSTRACT

An organic electroluminescent panel having a silver alloy is disclosed, which has a substrate; a plurality of the first electrodes; a plurality of the second electrodes; a plurality of conducting lines containing a silver alloy; a plurality of isolating walls; and a plurality of organic electroluminescent media. The first electrodes are arranged in parallel on the substrate. The organic electroluminescent media are disposed on the first electrodes. The second electrodes are disposed on the organic electroluminescent media. The conducting lines containing the silver alloy connect to the first electrodes or the second electrodes. The silver alloy contained in the conducting lines has 80 to 99.8 mol % of silver; 0.1 to 10 mol % of copper; and 0.1 to 10 mol % of at least one transition metal selected from the group consisting of palladium (Pd), magnesium (Mg), gold (Au), platinum (Pt), and the combinations thereof.

19 Claims, 2 Drawing Sheets

SILVER ALLOY USED IN AN ORGANIC ELECTROLUMINESCENT PANEL

BACKGROUND OF THE INVENTION

1. Field of the Invention

The present invention relates to a silver alloy used in an organic electroluminescent panel and, more particularly, to a silver alloy suitably serving as an auxiliary electrode or a conducting line in an organic electroluminescent panel.

2. Description of Related Art

The organic electroluminescent panel is a device that utilizes the organic functional materials, which radiate spontaneously to achieve image display. According to the molecular weight of the organic functional materials, the organic electroluminescent panel is classified as two types, i.e. the small molecule OLED (SM-OLED) and the polymer light-emitting device (PLED). On the other hand, the organic electroluminescent panel is also classified as two types, i.e. the active matrix OLED (AM-OLED) and the passive matrix OLED (PM-OLED) according to the driving method.

Currently, most of the semiconductor and the flat panel displays use chromium (Cr) to form the conducting lines or the auxiliary electrodes. However, chromium has a high resistance and high power consumption. Therefore, researchers continue to look for a metal that has low resistance to form the conducting lines or the auxiliary electrodes. In the past, it had been suggested to form the conducting lines using silver. As there were no suitable and stable etchants for the silver, it was not used widely.

In particular, when the silver is exposed to the atmosphere containing sulfur, it reacts with the sulfur and becomes black on its surface. In another aspect, when the silver is exposed to ammonia, it produces a silver-ammonia complex compound, which blurs the originally shiny surface of the silver. Moreover, such kinds of reactions will keep growing and dispersing whereby the surface quality of the silver is seriously damaged so it is not suitable to use pure silver to form the conducting lines or the auxiliary electrodes.

It was also suggested to use aluminum or copper that were commonly used in semiconductor manufacturing to form the conducting lines or the auxiliary electrodes. However, aluminum or copper often cause problems of electron migration, hillock, and corrosion in forming the conducting lines or the auxiliary electrodes, so they are not suitable materials for the conducting lines and the auxiliary electrodes, either. IZO alloy was also suggested to cooperate with molybdenum (Mo) for forming the conducting lines or the auxiliary electrodes. Nevertheless, that alloy has not been widely used in the flat panel display devices so far due to the relatively high cost and complex processing.

Therefore, it is desirable to provide a material with low resistance, high thermal conductivity, and good adhesion for forming the conducting lines or the auxiliary electrodes of the flat panel display device or the semiconductors to mitigate and/or obviate the aforementioned problems.

SUMMARY OF THE INVENTION

The present invention is to provide a silver alloy used in an organic electroluminescent panel for forming an auxiliary electrode and/or a conducting line with low resistance and good adhesion.

The present invention is further to provide an organic electroluminescent panel with silver alloy formed conducting lines or auxiliary electrodes so that the power consumption of the organic electroluminescent panel is lowered.

In accordance with the present invention, the silver alloy used in an organic electroluminescent panel of the present invention includes 80 to 99.8 mol % of silver; 0.1 to 10 mol % of copper; and 0.1 to 10 mol % of at least one transition metal selected from the group consisting of palladium (Pd), magnesium (Mg), gold (Au), platinum (Pt), and the combinations thereof, wherein the total mole percentage of the silver alloy is 100 mol %. The silver alloy used in an organic electroluminescent panel of the present invention optionally has at least one adhesion improver further for improving the adhesion as the silver is formed on the substrate. The adhesion improver is optionally titanium (Ti), aluminum (Al), nickel (Ni), cobalt (Co), or chromium (Cr).

The organic electroluminescent panel of the present invention includes a substrate; a plurality of the first electrodes; a plurality of the second electrodes; a plurality of conducting lines containing a silver alloy; and a plurality of organic electroluminescent media; wherein the first electrodes are arranged in parallel on the substrate; the organic electroluminescent media are disposed on the first electrodes; the second electrodes are disposed on the organic electroluminescent media; the conducting lines containing the silver alloy connect to the first electrodes or the second electrodes; and the silver alloy contained in the conducting lines having: 80 to 99.8 mol % of silver; 0.1 to 10 mol % of copper; and 0.1 to 10 mol % of at least one transition metal selected from the group consisting of palladium (Pd), magnesium (Mg), gold (Au), platinum (Pt), and the combinations thereof, wherein the total mole percentage of the silver alloy is 100 mol %.

The organic electroluminescent medium is optionally constructed of single layer, or multilayer structure composed of, for instance, a hole injecting layer, a hole transporting layer, a light-emitting layer, an electron transporting layer, and an electron injecting layer.

Other advantages and novel features of the invention will become more apparent from the following detailed description when taken in conjunction with the accompanying drawings.

DETAILED DESCRIPTION OF THE PREFERRED EMBODIMENT

Figure 1:
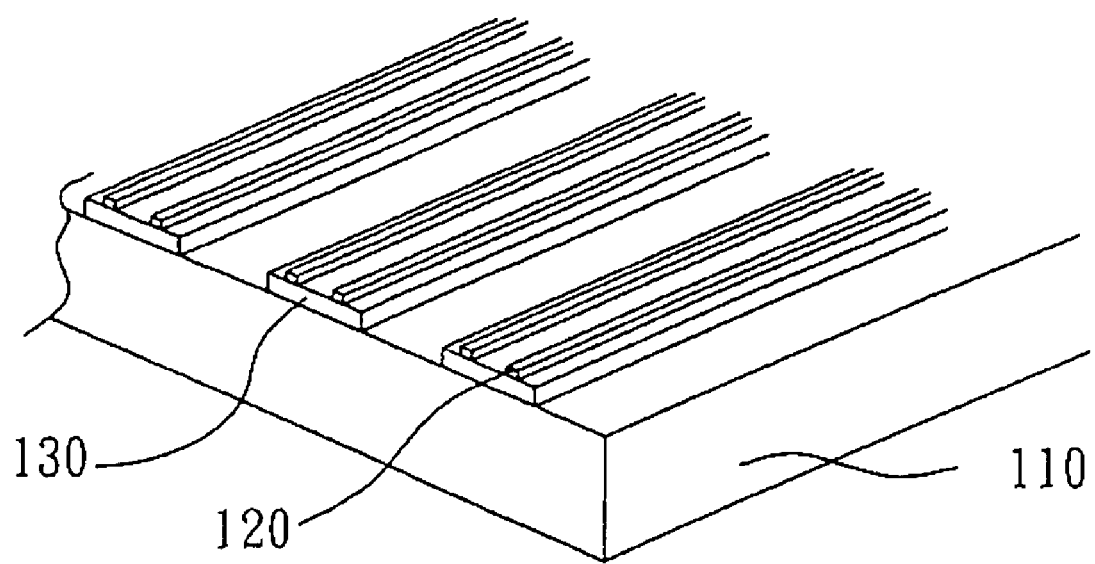
FIG. 1 is a perspective view showing the intermediate organic electroluminescent panel having auxiliary electrodes made of silver alloy of the present invention.
Figure 2:
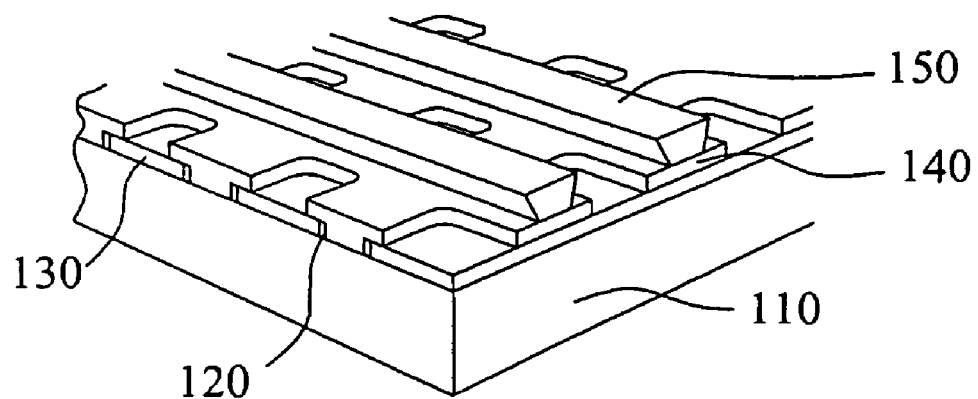
FIG. 2 is a perspective view showing the intermediate organic electroluminescent panel having auxiliary electrodes made of silver alloy of the present invention.
Figure 3:
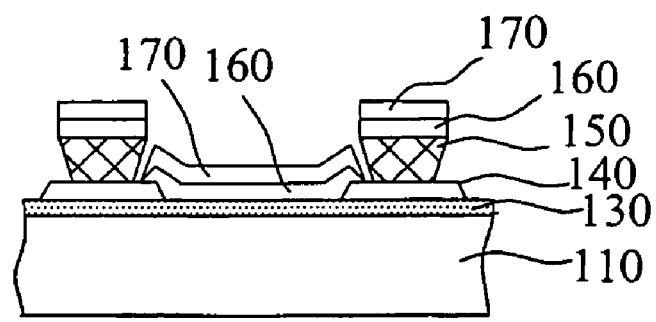
FIG. 3 is a side view showing the intermediate organic electroluminescent panel having auxiliary electrodes made of silver alloy of the present invention.

With reference to FIGS. 2 and 3, the organic electroluminescent panel of the present invention includes a substrate 110, a plurality of first electrodes 130, a plurality of second electrodes 170, a plurality of auxiliary electrodes 120 containing a silver alloy, a pixel-defining layer 140, a plurality of isolating walls 150, and an organic electroluminescent medium 160. The plural first electrodes 130 are arranged in parallel on the substrate 110. The plural auxiliary electrodes 120 are arranged in parallel on the first electrodes 130 (as shown in FIG. 1) or on the substrate 110 (as shown in FIG.

2). The pixel-defining layer 140 is formed on the substrate 110 and defines the area of each of the pixels of the organic electroluminescent panel. The isolating walls 150 protrude out of the substrate 110 and have an overhanging portion projecting in a direction to the substrate. The organic electroluminescent medium 160 is disposed on the first electrodes 130. The second electrode 170 is disposed on the organic electroluminescent medium 160. The auxiliary electrodes 120 contain 80 to 99.8 mol% of silver, 0.1 to 10 mol% of copper, and 0.1 to 10 mol% of at least one transition metal selected from the group consisting of palladium (Pd), magnesium (Mg), gold (Au), platinum (Pt), and the combinations thereof. The total mole percentage of the silver alloy is 100 mol%.

The plural conducting lines (not shown) containing the silver alloy connect to the first electrodes 130 or the second electrodes 170. The silver alloy of the conducting lines contains 80 to 99.8 mol % of silver, 0.1 to 10 mol % of copper, and 0.1 to 10 mol % of at least one transition metal selected from the group consisting of palladium (Pd), magnesium (Mg), gold (Au), platinum (Pt), and the combinations thereof. The total mole percentage of the silver alloy is 100 mol %.

The silver alloy of the present invention optionally further has at least one adhesion improver that improves the adhesion between the silver alloy and the substrate. The adhesion improver could contain 0.01 to 5 mol % of titanium (Ti), aluminum (Al), nickel (Ni), cobalt (Co), or chromium (Cr). The substrate of the organic electroluminescent panel of the present invention can be any transparent substrate that is generally used, such as a glass substrate, a plastic substrate, or a flexible substrate, among which the plastic substrate and the flexible substrate could be made of polycarbonate, polyester, cyclic olefin copolymer, metallocene-based cyclic olefin copolymer, respectively, or thin glass. The first electrodes (the anodes) are made of any known electrode materials, which is preferred to be $InSnO_3$, $SnO_2$, ZnO-doped $In_2O_3$, CdSnO, or antimony. Similarly, the second electrodes (the cathodes) are made of any known electrode materials, which is preferred to be MgAg, aluminum, diamond, diamond like carbon (DLC), or calcium. The organic electroluminescent medium of the present invention is optionally a single layer or a multilayer structure, and further, the multilayer structure optionally includes a hole injecting layer, a hole transporting layer, a light-emitting layer, an electron transporting layer, or an electron injecting layer. The number or shape of the first electrodes or the second electrodes is not restricted. Preferably, the first electrodes or the second electrodes are plurally laid in a striped configuration. The organic electroluminescent panel of the present invention further includes a plurality of isolating walls, which are located on the substrate or on the first electrodes, and between the adjacent second electrodes. The arrangement of the isolating walls is not restricted, and preferably the isolating walls are parallel with each other. The intersection manner of the projections of the first and the second electrodes on the substrate is not restricted. Preferably, the projection of the second electrodes on the substrate intersects perpendicularly with that of the first electrodes on the substrate. The organic electroluminescent panel of the present invention optionally includes a pixel-defining layer formed on the first electrodes or on the auxiliary electrodes before forming the isolating walls.

The organic electroluminescent panel of the present invention is compared with a prior art that uses Cr to form the auxiliary electrodes under the same structure and luminance. The power consumptions are listed in the following tables, respectively.

| | Luminance: 80 cd/m2 | | | |
|---|---|---|---|---|
| auxiliary electrodes | V | I(mA) | Power Consumption (mW) | (%) |
| Cr 3000 A ITO 1500 A | 11.67 | 26.68 | 311.38 | 100 |
| Ag alloy 4000 A ITO 2200 A | 9.93 | 21.29 | 211.44 | 68 |

| | Luminance: 100 cd/m2 | | | |
|---|---|---|---|---|
| auxiliary electrodes | V | I(mA) | Power Consumption (mW) | (%) |
| Cr 3000 A ITO 1500 A | 12.63 | 35.1 | 444.3 | 100 |
| Ag alloy 4000 A ITO 2200 A | 10.39 | 27.76 | 288.4 | 65 |

| | Luminance: 150 cd/m2 | | | |
|---|---|---|---|---|
| Auxiliary electrodes | V | I(mA) | Power Consumption (mW) | (%) |
| Cr 3000 A ITO 1500 A | 15.27 | 53.31 | 814 | 100 |
| Ag alloy 4000 A ITO 2200 A | 11.93 | 44.29 | 528.4 | 65 |

From comparing the above results, it is obvious that the silver alloy used in an organic electroluminescent panel of the present invention has a lower resistance than the prior used Cr. Moreover, the silver alloy of the present invention also has a good adhesion, and is extremely suitable to form the conducting lines and the auxiliary electrodes of the organic electroluminescent panels. Consequently, the power consumption of the organic electroluminescent panel manufactured by using the silver alloy according to the present invention is vastly lowered, so the lifetime of the organic electroluminescent panel is prolonged, and the operation scope of the organic electroluminescent panel is broadened. After going through the accelerated environment test with high humidity and high temperature of around 85H/85° C., the organic electroluminescent panel of the present invention passed the peeling test that performed an accelerated and destructive testing of adhesion by using an adhesive tape. Hence it is quite obvious that the present invention has a better performance than the prior arts.

Although the present invention has been explained in relation to its preferred embodiment, it is to be understood that many other possible modifications and variations can be made without departing from the spirit and scope of the invention as hereinafter claimed.

What is claimed is:

1. A silver alloy used in an organic electroluminescent panel, to serve as an auxiliary electrode and/or a conducting line, comprising:
   80 to 99.8 mol % of silver;
   0.1 to 10 mol % of copper;

0.1 to 10 mol % of at least one transition metal selected from the group consisting of palladium (Pd), magnesium (Mg), gold (Au), platinum (Pt), and the combinations thereof; and at least one adhesion improver, wherein the adhesion improver is selected from the group consisting of titanium (Ti), aluminum (Al), nickel (Ni), cobalt (Co), and chromium (Cr);

wherein the total mole percentage of the silver alloy is 100 mol %.

2. The silver alloy as claimed in claim 1, wherein the adhesion improver is in the range of 0.01 to 5 mol %.

3. An organic electroluminescent panel comprising:
a substrate;
a plurality of the first electrodes;
a plurality of the second electrodes;
a plurality of conducting lines containing a first silver alloy; and
a plurality of organic electroluminescent media;
wherein the first electrodes are arranged in parallel on the substrate; the organic electroluminescent media are disposed on the first electrodes; the second electrodes are disposed on the organic electroluminescent media; the conducting lines containing the first silver alloy connect to the first electrodes or the second electrodes; and the first silver alloy contained in the conducting lines having: 80 to 99.8 mol % of silver; 0.1 to 10 mol % of copper; 0.1 to 10 mol % of at least one transition metal selected from the group consisting of palladium (Pd), magnesium (Mg), gold (Au), platinum (Pt), and the combinations thereof; and at least one adhesion improver selected from the group consisting of titanium (Ti), aluminum (Al), nickel (Ni), cobalt (Co), and chromium (Cr); wherein the total mole percentage of the first silver alloy is 100 mol %.

4. The organic electroluminescent panel as claimed in claim 3 further comprising a plurality of auxiliary electrodes containing a second silver alloy.

5. The organic electroluminescent panel as claimed in claim 4, wherein the auxiliary electrodes are arranged in parallel on the first electrodes or on the substrate.

6. The organic electroluminescent panel as claimed in claim 4, wherein the second silver alloy contained in the auxiliary electrodes comprises:
80 to 99.8 mol % of silver;
0.1 to 10 mol % of copper; and
0.1 to 10 mol % of at least one transition metal selected from the group consisting of palladium (Pd), magnesium (Mg), gold (Au), platinum (Pt), and the combinations thereof, wherein the total mole percentage of the silver alloy is 100 mol %.

7. The organic electroluminescent panel as claimed in claim 3 further comprising a plurality of isolating walls.

8. The organic electroluminescent panel as claimed in claim 7, wherein the isolating walls protrude from the substrate and have an overhanging portion projecting in a direction to the substrate.

9. The organic electroluminescent panel as claimed in claim 3 further comprising a pixel-defining layer disposed on the first electrodes.

10. The organic electroluminescent panel as claimed in claim 9, wherein the pixel-defining layer is made of polyimide.

11. The organic electroluminescent panel as claimed in claim 6, wherein the second silver alloy further comprises at least one adhesion improver, wherein the adhesion improver is selected from the group consisting of titanium (Ti), aluminum (Al), nickel (Ni), cobalt (Co), and chromium (Cr).

12. The organic electroluminescent panel as claimed in claim 3, wherein the adhesion improver is in the range of 0.01 to 5 mol %.

13. The organic electroluminescent panel as claimed in claim 11, wherein the adhesion improver is in the range of 0.01 to 5 mol %.

14. The organic electroluminescent panel as claimed in claim 7, wherein the isolating walls are parallel with each other.

15. The organic electroluminescent panel as claimed in claim 3, wherein the projection of the second electrodes on the substrate intersects perpendicularly with that of the first electrodes on the substrate.

16. The organic electroluminescent panel as claimed in claim 3, wherein the substrate is selected from the group consisting of the glass substrates, the plastic substrates, and the flexible substrates.

17. The organic electroluminescent panel as claimed in claim 16, wherein the plastic substrates and the flexible substrates are made of the materials respectively selected from the group consisting of polycarbonate (PC), polyester (PET), cyclic olefin copolymer (COC), metallocene-based cyclic olefin copolymer (mCOC), thin glass, and the combinations thereof.

18. The organic electroluminescent panel as claimed in claim 3, wherein the organic electroluminescent medium is constructed of single layer or multilayer structure.

19. The organic electroluminescent panel as claimed in claim 18, wherein the organic electroluminescent medium constructed of the multilayer structure includes a hole injecting layer, a hole transporting layer, a light-emitting layer, an electron transporting layer, and an electron injecting layer.

* * * * *